United States Patent [19]

Tien et al.

[11] Patent Number: 5,763,895
[45] Date of Patent: Jun. 9, 1998

[54] SOURCE INNER SHIELD FOR EATON NV-10 HIGH CURRENT IMPLANTER

[75] Inventors: Fu-Kang Tien; H. J. Chang, both of Hsin Chu, Taiwan

[73] Assignee: Taiwan Semiconductor Manufacturing Company Ltd., Hsin-Chu, Taiwan

[21] Appl. No.: 782,709

[22] Filed: Jan. 13, 1997

[51] Int. Cl.⁶ .................................... H01J 37/20
[52] U.S. Cl. ...................................... 250/492.21
[58] Field of Search .................. 250/492.21, 423 R, 250/424; 15/301, 302

[56] References Cited

U.S. PATENT DOCUMENTS

| | | | |
|---|---|---|---|
| 4,719,355 | 1/1988 | Meyers et al. | 250/425 |
| 5,391,275 | 2/1995 | Mintz | 204/192.32 |
| 5,455,426 | 10/1995 | Forgey et al. | 250/492.21 |
| 5,497,006 | 3/1996 | Sferlazzo et al. | 250/427 |

*Primary Examiner*—Kiet T. Nguyen
*Attorney, Agent, or Firm*—George O. Saile; Stephen B. Ackerman

[57] ABSTRACT

A plurality of removable shields are disclosed for use with ion source in ion implanters. Specifically, the shields fit over the extraction electrode assembly, the sides of the interior walls and the cold-plate inside an ion source chamber. The shields are easily mountable and dismountable by the maintenance personnel. It is shown that shields can very effectively protect the insides of ion source from contamination by toxic materials emanating from the ionization source. A method is also disclosed for cleaning the shields outside the ion source by means of bead blasting followed by washing by deionized water and rinse with isopropyl alcohol. It is shown that the turn-around-time for preventive maintenance of an ion source in an ion implanter can be shortened by a factor of four.

4 Claims, 3 Drawing Sheets

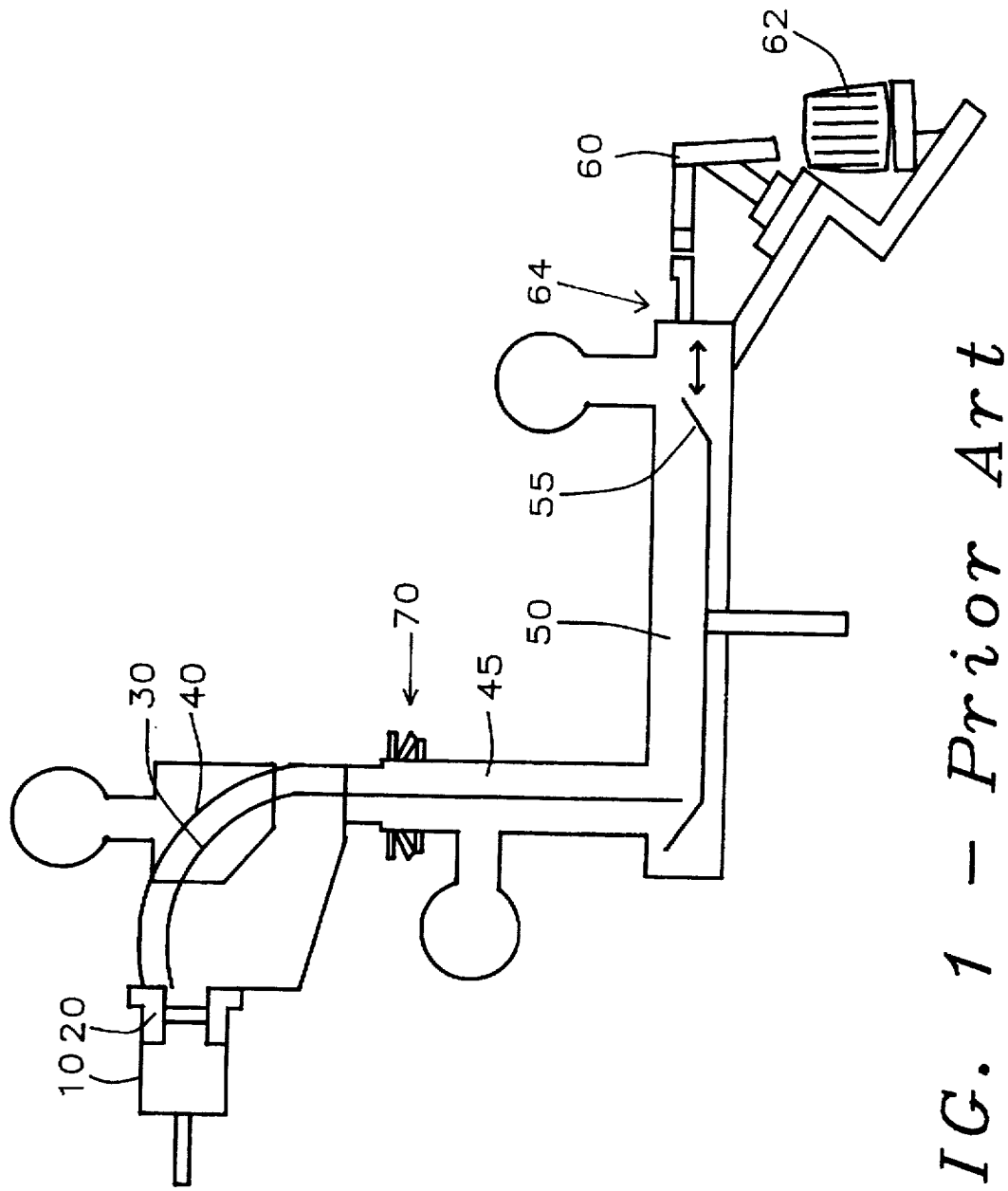
FIG. 1 – Prior Art 5,763,895

1

SOURCE INNER SHIELD FOR EATON NV-10 HIGH CURRENT IMPLANTER

BACKGROUND OF THE INVENTION (1) Field of the Invention

The present invention relates generally to ion implanters, and more particularly to an ion source having new shields for improved cleaning and maintenance of the ion source.

(2) Description of the Related Art

In semiconductor manufacturing, ion implantation is primarily used to introduce dopant ions into silicon wafers. This is accomplished by generating, in an ion implanter, a gas plasma such that the resultant particles can be accelerated under the influence of electric field, and directed onto a semiconductor substrate for implantation to a desired depth beneath the surface of the substrate. Because of its superiority over chemical doping, ion implantation has replaced diffusion (chemical) doping in an increasing number of VLSI (very large scale integration) applications. Along with it, however, it has brought some new problems—cleaning and maintenance of the equipment being one of the important ones—both from an operational point of view, as well as the safety of workers.

In general, problems associated with cleaning and maintenance are exacerbated by the complexity of the ion implanters used in the fabrication of VLSI. Complexity arises from the many subsystems that the implanters usually have. Each of the subsystems contain several components and they are exposed to materials which can be extremely hazardous. Most commonly used materials, called feed source, for implanting silicon are boron (B), phosphorous (P) and arsenic (As). They can be lethal when supplied in gaseous form, such as $BF_3$, $PH_3$, $AsH_3$, or less toxic when generated from solid sources. The insides of chambers that are exposed to these materials must be cleaned at regular intervals as a preventive maintenance measure.

One of the subsystems that is critical to the operation of ion implanters is a chamber called the ion source where feed source material is ionized. Ionization is accomplished usually by first heating the feed source molecules to a desired temperature and vaporizing it. Then the particles are directed to an arc chamber where ions are formed typically through collision with electrons from an arc discharge. An ion extraction and analyzing device next selects only the ion species of interest, and rejects all others forming an ion beam that is separated from the remaining species by an analyzing magnet. By adjusting the magnetic filed strength, only the ionic specie of interest is given a particular trajectory that allows it to pass through a resolving slit (aperture) and into an acceleration tube. The evacuated tube creates the acceleration field to adjust the ion energy to the desired energy level, focuses the ion beam to a particular size and shape, and distributes the ions uniformly over the target area, namely, the semiconductor substrate. Of the subassemblies that is most exposed to many different specie of the hazardous feed source is the ion source. This is seen in FIG. 1.

In the ion implantation system shown in FIG. 1, ion generating source (10) provides the needed ion beam (30) which is formed by an ion extraction electrode assembly (20). The path of ion beam (30) is controlled by analyzing magnet (45) and the beam is directed into acceleration tube (70) and then on to implantation chamber (50). It should be noted that analyzing magnet (45) is supported by a high-voltage system which is not shown in FIG. 1; neither is a movable system that allows the implantation chamber (50) to be aligned relative to the ion beam (30) for they do not directly pertain to the aspects of this invention. Suffice it to say that ion beam (30) impinges upon one or more silicon wafers that are automatically placed on a rotating platform (55) by means of a robot arm (60) that transfers wafers back and forth between a wafer holder (62) and the platform (55) through a vacuum port (64). Ion beam (30) impacts each of the wafer and selectively dopes those wafers with ion impurities. It will be observed that subassemblies other than the ion source (10) are exposed to only the ions of selected beam (30).

The ion implanter shown in FIG. 1 is of the high current type with maximum beam current of about 10 milliamps (mA) and energies ranging between about 10 to 160 kilo electron volts (keV), and includes a spinning platform for moving multiple silicon wafers through the ion beam. Ion beam (30) is wide enough to impact an entire wafer surface as the platform rotates each wafer though the ion beam. Another type of implanter, known as medium current implanter, treats one wafer at a time with a total beam current of up to 2 mA and maximum energies of about 200 keV. The medium current implanters use beam shaping electronics to deflect a relatively narrow beam from its initial trajectory to selectively dope or treat the entire wafer surface. In comparison with the medium current implanters, it is found that the particulate residues and contaminants left behind in the ion source chamber of high current implanters are much denser and cover much larger surface area. Also, high current implanters contain more components in their ion source chamber and therefore are more susceptible to collecting particulates during the process of ionization.

One of the additional components that have a large area and that is usually covered with particulate matter generated during ionization is the cold plate. It will be known to those skilled in the art that cold-plate is necessitated because of the high temperatures encountered with high current implanters. Furthermore, the cold-plate is usually not easily accessible through the access door to the ion source.

Generally, dismounting parts of an ion implanter for purposes of cleaning is very time consuming and labor intensive. On the other hand, reaching into the interior of the ion source, cleaning the chamber walls, other surfaces around the cold-plate as well as around extraction electrode assembly is difficult and hazardous for personnel responsible for preventive maintenance. In prior art, there have been attempts made—and successfully—at shielding certain components, but only locally rather than globally for the entire interior of an ion source. In U.S. Pat. No. 5,497,006, for example, heated filament cathode is shielded from plasma stream locally so that the life of the filament can be extended. No shielding attempt is made in U.S. Pat. No. 4,719,355 even when dopants are vaporized from solid in a crucible inside the ion source. The interior walls, and other components inside the ion source are covered with particulate matter emanating from the crucible. It is therefore the purpose of this invention to disclose techniques for facilitating the protection of the largest portion of the interior surfaces of an ion source and other components that reside inside the ion source. It is believed that the disclosures herein will result in more cost effective maintenance of ion implanters with much reduced hazard to workers on the semiconductor manufacturing line than presently available in the state of the art.

SUMMARY OF THE INVENTION

It is therefore an object of this invention to provide an ion implanter having a new shield for protecting the walls of ion source chamber from toxic coatings.

It is another object of this invention to provide an ion implanter having a new shield for protecting cold-plate in an ion source from toxic coatings.

It is still another object of this invention to provide an ion implanter having a new shield for protecting extraction electrode assembly in an ion source from toxic coatings.

It is yet another object of this invention to provide method for cleaning the ion source of an ion implanter with much improved safety and turn-around-time.

In accordance with the aforementioned objects, there is provided an easily mountable and removable shield to fit inside the walls of ion source in an ion implanter. There is provided another easily mountable and removable shield to serve as a cover over cold-plate in ion source of an ion implanter. Still another shield that is easily mountable and removable is provided to cover the extraction electrode assembly in ion source of an ion implanter.

In accordance with the aforementioned objects, there is also provided a method for mounting and removing shields on components in ion source of an ion implanter. Furthermore, a new cleaning technique is disclosed for cleaning the new shields.

BRIEF DESCRIPTION OF THE DRAWINGS

The objects and features of this invention will become apparent more readily from a reading of the description in conjunction with drawings wherein similar numerals refer to similar parts throughout the several views that follow:

FIG. 1 is a schematic drawing showing subsystems of an ion implanter of prior art.

FIG. 3b is another new shield of this invention for protecting from toxic coatings the interior walls of the ion source of FIG. 2a. FIG. 3c is yet another new shield of this invention for protecting from toxic coatings the cold-plate of the ion source of FIG. 2a.

DESCRIPTION OF THE PREFERRED EMBODIMENTS

Figure 2A:
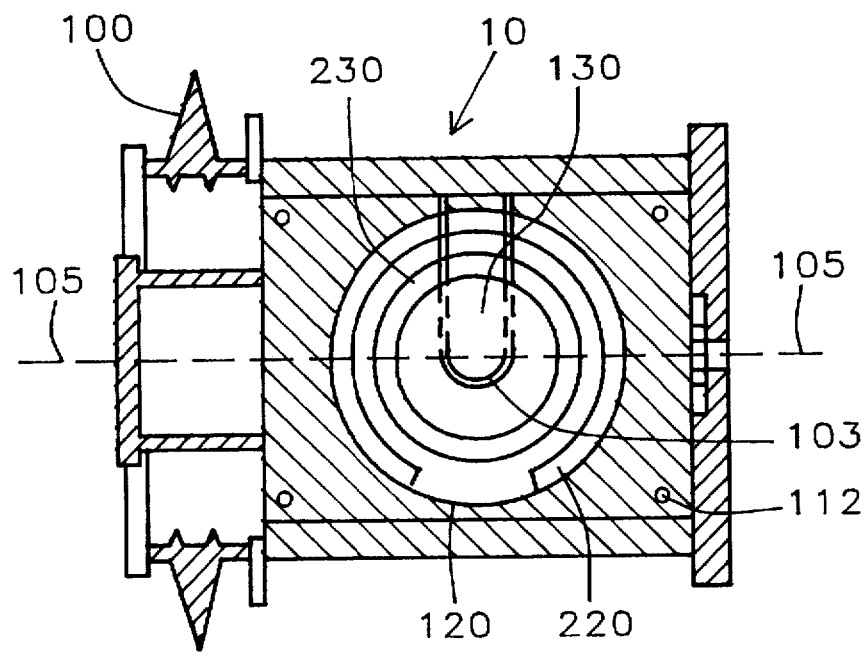
FIG. 2a is a schematic drawing showing subsystem ion source of this invention having protective shields.

Referring now to the drawings, in particular to FIGS. 2a–2b and FIGS. 3a–3c, there are shown schematic drawings of an ion source having protective shields, and three particular shields according to this invention, respectively. FIG. 2a is an enlarged view of ion source (10) of the same numeral subsystem shown in FIG. 1. As the general parts of an ion source in an ion implanter are well known in the art, only those components that are pertinent to the present invention are specifically shown in FIG. 2a, namely, the isolation bushing (100), the path of ion beam (105), the cold-plate (130) along with its cooling pipes (103) and the interior walls (120). The extraction electrode assembly (110) is shown with phantom lines in the top view of FIG. 2b but is removed from FIG. 2a to show the interior (120) of the ion source (10). Four mounting holes (112) for the extraction electrode plate are, however, shown in FIG. 2a.

Figure 2B:
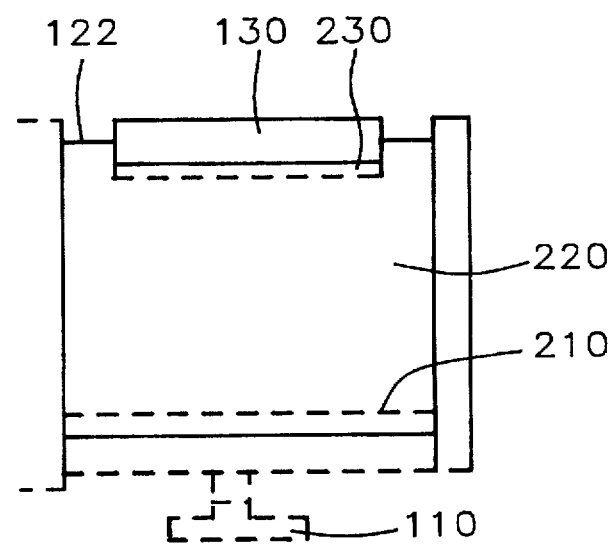
FIG. 2b is a partial top view of FIG. 2a showing the relative positions of shields for ion source chamber, cold-plate and extraction electrode assembly.
Figure 3A:
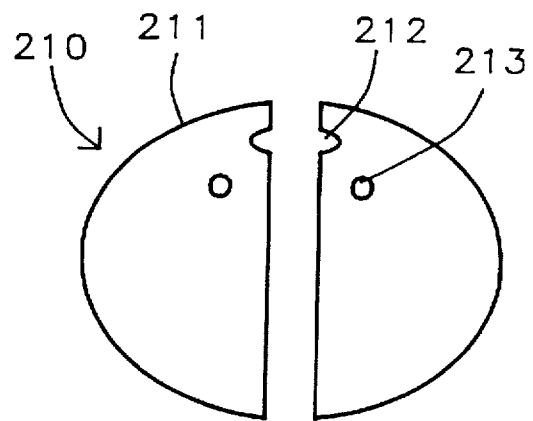
FIG. 3a is a new shield of this invention for protecting from toxic coatings the extraction electrode assembly in the ion source of FIG. 2b.

FIG. 3a shows shield (210) for the extraction electrode assembly (110) indicated schematically in FIG. 2b. Shield (210) is generally elliptical in shape with two symmetrical portions (211) forming each half of the ellipse having a major axis between about 250 to 260 mm and a minor axis between about 220 to 230 mm. Thus, shield (210) is preferably formed as one piece and then cut in half, thus forming a left portion and a right portion which are identically the same as seen in FIG. 3a. It will be appreciated however, that other techniques may be employed to form the two symmetrical portions without departing from the spirit of this invention.

It is preferred that the shape of shield (210) be elongatedly elliptical and larger than the area of extraction electrodes (110) so that as the former is placed over the latter, there would be a lip or an edge to grasp by the maintenance worker in placing and removing the shield for maintenance. The thickness of shield (210) is between about 1.0 to 1.2 mm and is preferred that it be made out of material stainless steel AISI 316. Notches (212) on shield (210) are generally shaped to accommodate the electrodes (not shown) around the extraction assembly (110) shown in FIG. 2b and it is preferred that there is a spacing between about 5 to 7 mm between the electrodes and the edge of notches (212). Holes (213) go over pegs (not shown) to support shield (210) on extraction electrode assembly (110) shown schematically in FIG. 2b.

Figure 3B:
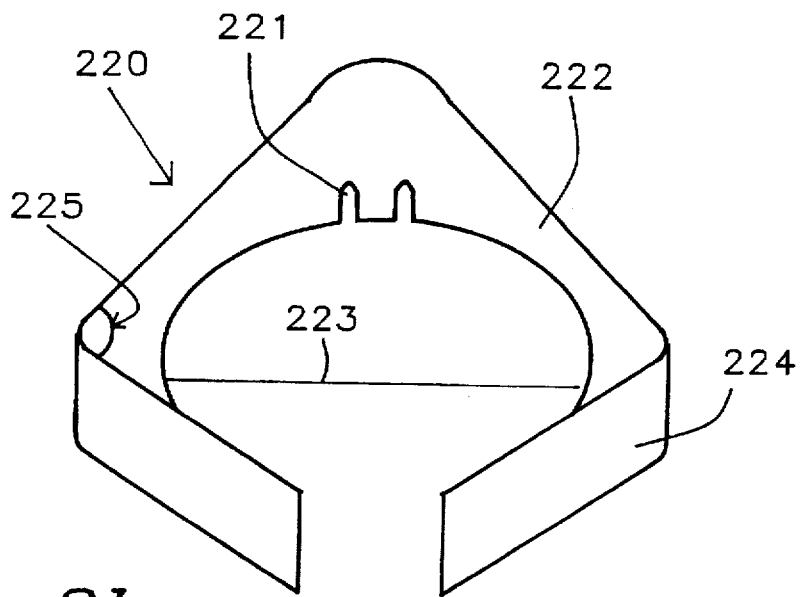
Figure 3C:
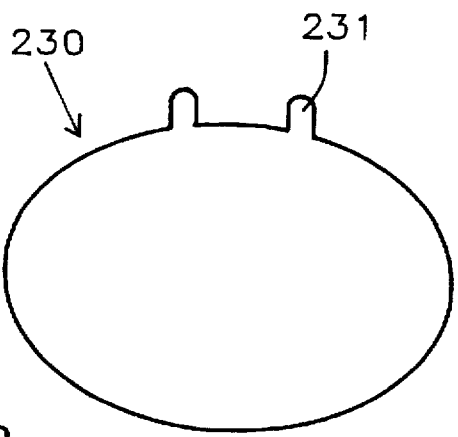

The protection of the remaining interior walls of ion source (10) is provided by a second shield (220) that is shown in FIG. 3b. It will be noted that second shield (220) comprises a back portion (222) having a semi-circular aperture and two front portions (224) like folded arms that conform to the shape of the inside (120) of ion source (10). It will be appreciated that arm (224) can be shaped to accommodate many different interior designs of commercially available ion sources. The aperture has a diameter between about 230 to 240 mm. Furthermore, second shield (220), like first shield (210) has elongated holes (221) to hang over pegs (not shown) on the rear wall (122) of ion source (10) better seen in top view in FIG. 2b. Thus, with both shields, maintenance personnel can quickly mount and dismount said shields with ease without prolonged exposure to parts that are contaminated with toxic materials inside the ion source.

The back portion (222) of second shield (220) in FIG. 3b is generally of a equilateral triangular shape with a base dimension (223) between about 240 to 250 mm. It is generally preferable to round off the apices of the equilateral triangle (222), though this is not necessary. The two wrap-around arms (224) are bent at an angle (225) between about 120 to 130 degrees as shown in FIG. 3b and extend to a length between about 170 to 180 mm. The material for the second shield is preferred to be stainless steel AISI 316, and of a thickness between about 1.0 to 1.2 mm. Other materials which are corrosion and abrasion resistant can also be used.

In the rear of ion source (10) shown in FIG. 2b, and offset from wall (122) is cold-plate (130) connected to cooling coils (103). Having a large surface area, cold plate in an ion source is usually susceptible to collecting particulate matter easily. Furthermore, build up of such residues on a cold-plate readily fouls the heat transfer capabilities of the cold-plate, rendering it ineffective in cooling the ion source. It is critical therefore that a shield be provided to protect the surface of cold-plate (130) from contaminants emanating during ionization in ion source (10) and a third shield (230) in FIG. 3c, performs that function.

Shield (230) is preferably of elongated elliptical, or oblong shape with a major axis between about 180 to 190 mm, and a minor axis between about 160 to 170 mm. It is preferred that the material of shield (230) is stainless steel AISI 316 with a thickness between about 1.0 to 1.2 mm. Hooks (231) are provided to mount shield (230) on cold plate (130).

The ease with which shields (210), (220) and (230) can be used in the maintenance of ion source (10) will be appreciated by those skilled in the art through the portability and handlebility of the stated shields. All three shields individually weigh much less than the various components of ion implanters that would have to be dismounted and mounted again for cleaning. The time it takes to clean the shields outside of the ion source (10) is much less than the time it takes to clean the insides of the ion source. It has been the experience on our manufacturing line that the cleaning time can be reduced by a factor of four in comparison with conventional cleaning of the insides of an ion source.

In addition to the advantages of quicker turn-around-times in accomplishing preventive maintenance on ion sources, the use of portable shields and cleaning thereof outside of ion source chamber in an unobstructed way also makes possible to employ better cleaning techniques, materials and cleaning devices that would otherwise be very difficult and awkward to apply inside the confines of an ion source chamber. Specifically, our experience on the manufacturing line has shown that using bead blasting on the shields followed by scrubbing and ultrasonic washing with deionized water , and then rinsing with isopropyl alcohol $CH_3CHOHCH_3$ yield excellent results. Preferably, bead blasting is accomplished at a pressure between about 210 to 220 kiloPascals (kPa). It will be obvious to those skilled in the art that bead blasting inside an ion source chamber is not practical and not desirable. Furthermore, using blasting on the shields provides not only improved method of cleaning, but also helps reduce the cleaning time by a factor of four.

In the embodiments described above, numerous details were set forth, such as specific materials, process parameter, etc., in order to provide a thorough understanding of the present invention. It will be obvious, however, to those skilled in the art that these specific details need not be employed to practice the present invention. The methods disclosed in this invention are applicable to ion implanters wherein the size and shape of ion sources can vary considerably from one to the other. The shields disclosed here and their use thereof are equally applicable to interiors of different designs, cold-plates of other shapes, and extraction electrode plates of different sizes. Thus, the back of shield (220) can be other than of an equilateral triangle, or shields for cold-plate and extraction electrode assembly can be of circular or other shapes.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of cleaning shields of an ion source in an ion implanter comprising the steps of:
   bead blasting said shields;
   ultrasonic washing said shields thereafter; and
   rinsing said shields thereafter.

2. The method of claim 1, wherein said blasting is accomplished at a pressure between about 210 kPa to 220 kPa.

3. The method of claim 1, wherein said ultrasonic washing is accomplished with deionized water.

4. The method of claim 1, wherein said rinsing is accomplished with isopropyl alcohol.

* * * * *